(12) United States Patent
Aune

(10) Patent No.: US 11,811,410 B2
(45) Date of Patent: Nov. 7, 2023

(54) SENSORS, AUTONOMOUS SENSORS AND RELATED SYSTEMS, METHODS AND DEVICES

(71) Applicant: Microchip Technology Incorporated, Chandler, AZ (US)

(72) Inventor: Amund Aune, Trondheim (NO)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 17/247,954

(22) Filed: Dec. 31, 2020

(65) Prior Publication Data

US 2022/0060181 A1 Feb. 24, 2022

Related U.S. Application Data

(60) Provisional application No. 62/706,486, filed on Aug. 19, 2020.

(51) Int. Cl.
*H02M 1/08* (2006.01)
*H03K 5/08* (2006.01)
*H03K 5/12* (2006.01)

(52) U.S. Cl.
CPC .......... *H03K 5/12* (2013.01); *H02M 1/08* (2013.01); *H03K 5/082* (2013.01)

(58) Field of Classification Search
CPC .......... H02M 1/00; H02M 1/08; H03K 17/00; H03K 17/163; H03K 19/00; H03K 19/00361; H03K 19/00384; H03K 5/00; H03K 5/01; H03K 5/082; H03K 5/12
USPC ........................................................ 327/170
See application file for complete search history.

(56) References Cited

U.S. PATENT DOCUMENTS

| 2004/0014083 | A1 | 1/2004 | Yuan et al. |
| 2004/0140833 | A1* | 7/2004 | Kim ................ H03K 17/166 327/170 |
| 2018/0017621 | A1* | 1/2018 | Cilek ............... G01R 31/31937 |

FOREIGN PATENT DOCUMENTS

EP 1227591 A1 7/2002

OTHER PUBLICATIONS

International Search Report from International Application No. PCT/US2020/06//03, dated May 18, 2021, 4 pages.
International Written Opinion from International Application No. PCT/US2020/067703, dated May 18, 2021, 9 pages.

* cited by examiner

*Primary Examiner* — William Hernandez
(74) *Attorney, Agent, or Firm* — TraskBritt

(57) ABSTRACT

Disclosed embodiments relate to sensing states and changes of states of a signal and sensors for the same, including but not limited to, autonomous sensors. Such sensor may include an analog signal threshold detection circuit, a state detection circuit, and a measurement circuit. The analog signal threshold detection circuit may be configured to alternately assert and de-assert a threshold detected indication in response to an input signal and a state thereof. The state detection circuit may be configured to generate a signal state indication about a state of the input signal. The measurement circuit may be configured to generate a measurement in response to assertions of the threshold detected indication and the signal state indication, such as a count, a slew rate, or a frequency. In some embodiments, disclosed sensors may have programmable thresholds for sensing the signal states and changes therein.

16 Claims, 9 Drawing Sheets

SENSORS, AUTONOMOUS SENSORS AND RELATED SYSTEMS, METHODS AND DEVICES

CROSS-REFERENCE TO RELATED APPLICATION

This application claims the benefit under 35 U.S.C. § 119(e) of U.S. Provisional Patent Application Ser. No. 62/706,486, filed Aug. 19, 2020, entitled "AUTONOMOUS CORE INDEPENDENT DISCRETE SIGNAL SLEW RATE SENSORS," the disclosure of which is hereby incorporated herein in its entirety by this reference.

TECHNICAL FIELD

Embodiments discussed herein relate, generally, to electronic components, and more specifically to sensing states of discrete signals and sensors and autonomous sensors for performing the same. Some embodiments relate, generally, to sensors having programmable thresholds for sensing signal states. Some embodiments relate, generally, to slew rate sensing and frequency sensing.

BACKGROUND

Discrete signals are used in a variety of operational contexts. Non-limiting examples of discrete signals include: digital signals for communication, pulse width and pulse duration modulated signals, pulse density modulated signals, and clock signals.

BRIEF DESCRIPTION OF THE DRAWINGS

To easily identify the discussion of any particular element or act, the most significant digit or digits in a reference number refer to the figure number in which that element is first introduced.

DETAILED DESCRIPTION

Figure 1:
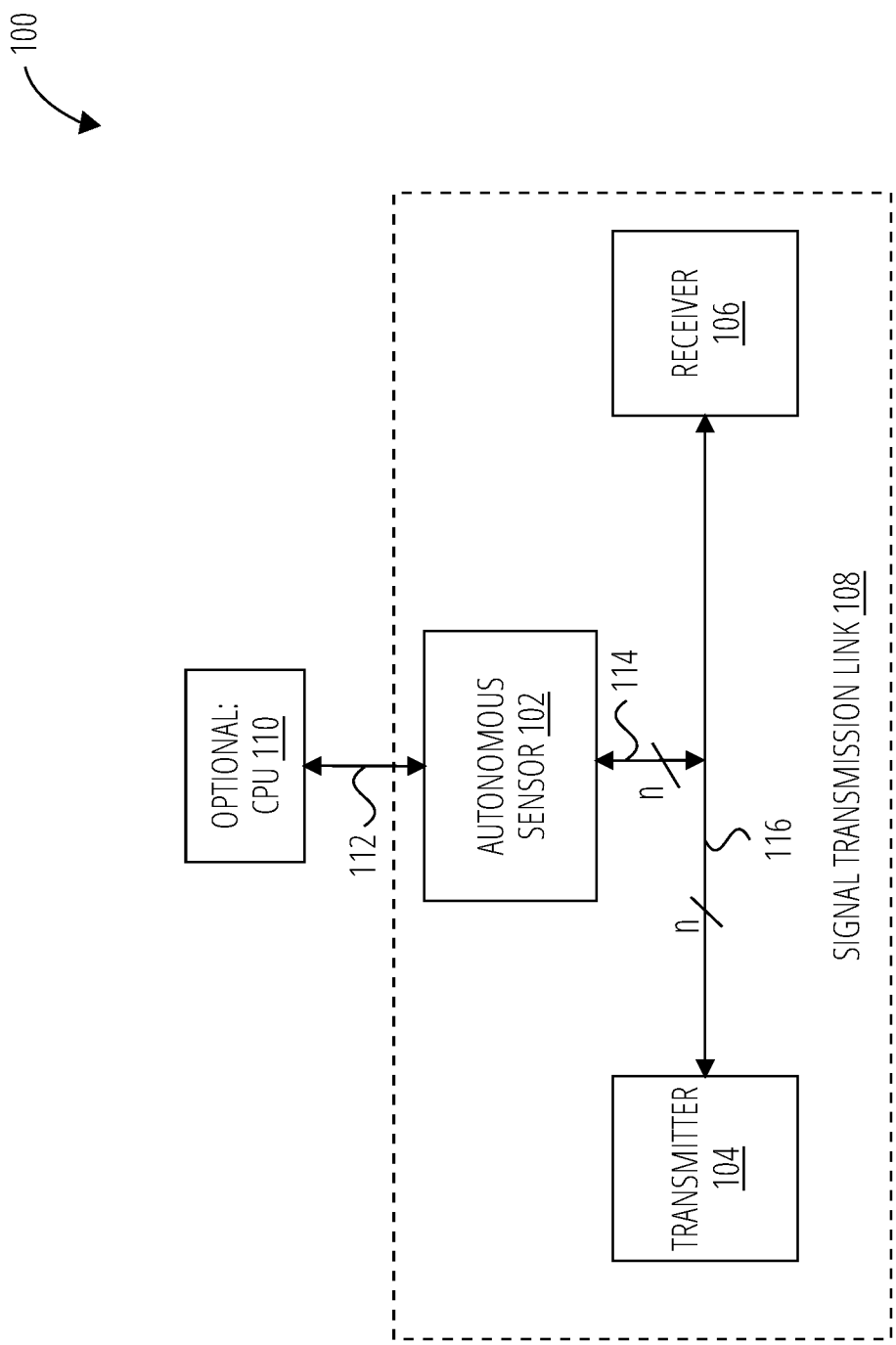
FIG. 1 is a block diagram of a signal transmission system in accordance with one or more embodiments.

In the following detailed description, reference is made to the accompanying drawings, which form a part hereof, and in which are shown, by way of illustration, specific examples of embodiments in which the present disclosure may be practiced. These embodiments are described in sufficient detail to enable a person of ordinary skill in the art to practice the present disclosure. However, other embodiments enabled herein may be utilized, and structural, material, and process changes may be made without departing from the scope of the disclosure.

The illustrations presented herein are not meant to be actual views of any particular method, system, device, or structure, but are merely idealized representations that are employed to describe the embodiments of the present disclosure. In some instances similar structures or components in the various drawings may retain the same or similar numbering for the convenience of the reader; however, the similarity in numbering does not necessarily mean that the structures or components are identical in size, composition, configuration, or any other property.

The following description may include examples to help enable one of ordinary skill in the art to practice the disclosed embodiments. The use of the terms "exemplary," "by example," and "for example," means that the related description is explanatory, and though the scope of the disclosure is intended to encompass the examples and legal equivalents, the use of such terms is not intended to limit the scope of an embodiment or this disclosure to the specified components, steps, features, functions, or the like.

It will be readily understood that the components of the embodiments as generally described herein and illustrated in the drawings could be arranged and designed in a wide variety of different configurations. Thus, the following description of various embodiments is not intended to limit the scope of the present disclosure, but is merely representative of various embodiments. While the various aspects of the embodiments may be presented in the drawings, the drawings are not necessarily drawn to scale unless specifically indicated.

Furthermore, specific implementations shown and described are only examples and should not be construed as the only way to implement the present disclosure unless specified otherwise herein. Elements, circuits, and functions may be shown in block diagram form in order not to obscure the present disclosure in unnecessary detail. Conversely, specific implementations shown and described are exemplary only and should not be construed as the only way to implement the present disclosure unless specified otherwise herein. Additionally, block definitions and partitioning of logic between various blocks is exemplary of a specific implementation. It will be readily apparent to one of ordinary skill in the art that the present disclosure may be practiced by numerous other partitioning solutions. For the most part, details concerning timing considerations and the like have been omitted where such details are not necessary to obtain a complete understanding of the present disclosure and are within the abilities of persons of ordinary skill in the relevant art.

Those of ordinary skill in the art will understand that information and signals may be represented using any of a variety of different technologies and techniques. Some drawings may illustrate signals as a single signal for clarity of presentation and description. It will be understood by a person of ordinary skill in the art that the signal may represent a bus of signals, wherein the bus may have a variety of bit widths and the present disclosure may be implemented on any number of data signals including a single data signal.

The various illustrative logical blocks, modules, and circuits described in connection with the embodiments disclosed herein may be implemented or performed with a general purpose processor, a special purpose processor, a digital signal processor (DSP), an Integrated Circuit (IC), an Application Specific Integrated Circuit (ASIC), a Field Programmable Gate Array (FPGA) or other programmable logic device, discrete gate or transistor logic, discrete hardware components, or any combination thereof designed to perform the functions described herein. A general-purpose processor (may also be referred to herein as a host processor or simply a host) may be a microprocessor, but in the alternative, the processor may be any conventional processor, controller, microcontroller, or state machine. A processor may also be implemented as a combination of computing devices, such as a combination of a DSP and a microprocessor, a plurality of microprocessors, one or more microprocessors in conjunction with a DSP core, or any other such configuration. A general-purpose computer including a processor is considered a special-purpose computer while the general-purpose computer is configured to execute computing instructions (e.g., software code) related to embodiments of the present disclosure.

The embodiments may be described in terms of a process that is depicted as a flow diagram, a structure diagram, or a block diagram. Although a flow diagram may describe operational acts as a sequential process, many of these acts can be performed in another sequence, in parallel, or substantially concurrently. In addition, the order of the acts may be re-arranged. A process may correspond to a method, a thread, a function, a procedure, a subroutine, a subprogram, other structure, or combinations thereof. Furthermore, the methods disclosed herein may be implemented in hardware, software, or both. If implemented in software, the functions may be stored or transmitted as one or more instructions or code on computer-readable media. Computer-readable media includes both computer storage media and communication media including any medium that facilitates transfer of a computer program from one place to another.

Any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. In addition, unless stated otherwise, a set of elements may include one or more elements.

As used herein, the term "substantially" in reference to a given parameter, property, or condition means and includes to a degree that one of ordinary skill in the art would understand that the given parameter, property, or condition is met with a small degree of variance, such as, for example, within acceptable manufacturing tolerances. By way of example, depending on the particular parameter, property, or condition that is substantially met, the parameter, property, or condition may be at least 90% met, at least 95% met, or even at least 99% met.

As used herein, any relational term, such as "over," "under," "on," "underlying," "upper," "lower," etc., is used for clarity and convenience in understanding the disclosure and accompanying drawings and does not connote or depend on any specific preference, orientation, or order, except where the context clearly indicates otherwise.

In this description the term "coupled" and derivatives thereof may be used to indicate that two elements co-operate or interact with each other. When an element is described as being "coupled" to another element, then the elements may be in direct physical or electrical contact or there may be intervening elements or layers present. In contrast, when an element is described as being "directly coupled" to another element, then there are no intervening elements or layers present. The term "connected" may be used in this description interchangeably with the term "coupled," and has the same meaning unless expressly indicated otherwise or the context would indicate otherwise to a person having ordinary skill in the art.

As used herein, "discrete signal" means a signal that generally exhibits a change in state between a first state and a second state. Such a discrete signal may change substantially monotonically from a first state to a second state, and may, additionally or alternatively, change substantially monotonically from the second state to the first state. Optionally, such a discrete signal may remain at a first state for a first period of time and remain at a second state for a second period of time. Such a first state and a second state may be respectively defined as threshold values or respectively defined as above or below threshold values.

The rate at which a discrete signal transitions from a first state, such as a first discrete value, to a second state, such as a second discrete value, during a given time period is referred to as its "slew rate." Slew rate can change. As a non-limiting example, a slew rate of a digital signal on a wired portion of a communication path may decay by an amount proportional to the length of the wired path. As another non-limiting example, a faulty or limited connector coupling electrical components may cause decay of a slew rate of a discrete signal. As yet another non-limiting example, a capacitive or resistive load on an electronic system (e.g., caused by a capacitive connection to a different voltage potential, e.g., by the physical proximity or touch of a human body or moisture, or a short circuit, without limitation.) may cause decay of a slew rate of a discrete signal. As a non-limiting example, in the case of a digital signal, slew rate decay may corrupt data recovered from the digital signal. Due to corrupt or missed data, communication may be misinterpreted by a receiver. In a microcontroller, a pulse-width modulated (PWM) or pulse-density modulated (PDM) signal may incorrectly control a peripheral device. When a clock signal increases slowly and passes a signal threshold for an input device, noise can cause the signal threshold to be repeatedly crossed. Erroneously detected threshold crossing and corrupted data can, as non-limiting examples, increase power consumption and cause undefined behavior for a circuit using a clock.

Sensors are sometimes used to measure a discrete signal, as a non-limiting example, to measure a slew rate to identify slew rate decay so a user can take some appropriate action. A typical slew rate sensor may be configured to detect specific voltage levels associated with a discrete signal and determine a rate at which the discrete signal transitions between such detected voltage levels. Some sensors, slew rate sensors or otherwise, may include analog voltage comparators, one for each of the specific discrete voltage levels to be detected. However, the inventor of this disclosure appreciates that, as compared to digital circuitry, analog signal comparators, voltage or otherwise, are generally demanding in terms of space (i.e., silicon real estate, without limitation), central processing unit (CPU) utilization (if the CPU is required to constantly reconfigure the analog comparator or monitor/supervise the output of the comparator—such as in a software implementation), and/or power required to accommodate the integrated circuitry for implementing analog electronic components.

Additionally or alternatively to analog hardware components, operation of a sensor, slew rate or otherwise, may be implemented in software. However, even if the software portion of such a sensor is limited to setup and maintenance, there would be intervention by a CPU, which occupies the CPU. This can reduce the efficiency of a computing system (e.g., an embedded system, a microcontroller system, or microelectronics without limitation) because CPU time is utilized by a non-core process of the system (e.g., setup and maintenance of a slew rate sensor, without limitation) rather than a core-process of the computing system. Moreover, each time a CPU performs operations related to the sensor, setup or maintenance, it consumes power at a CPU rate of consumption. In some cases, a system having a single or dual core CPU may simply not be able to accommodate a sensor that over-utilizes the CPU. Moreover, in the case of a slew rate or a frequency sensor, if a slew rate or frequency period to CPU speed ratio is too high the CPU will miss transitions between discrete signal levels or signal states.

The inventor of this disclosure appreciates that it would be desirable to have a slew rate sensor without some or all of the disadvantages discussed above.

One or more embodiments relate to sensor. Such a sensor may include an analog voltage threshold detection circuit, a measurement circuit, a state detection circuit, and one or more memories that have upper signal threshold values, lower signal threshold values, and measurements, stored thereon. The memories may be any type of suitable volatile or non-volatile type memory (e.g., random-access-memory (RAM), FLASH memory, read only memory (ROM), programmable ROM, erasable programmable ROM, electrically erasable programmable read-only memory EEPROM)), and variations thereon (such as read-mostly memory (RMM) and resistive memory, without limitation).

Disclosed herein is circuitry for sensing a state and/or changes in a state of a discrete signal, and which, in various embodiments, may be performed with or without intervention or supervision by a processing core or CPU. The capability to perform a task (e.g., measurements associated with slew rate sensing, without limitation) without intervention or supervision from a processing core or CPU is referred to herein as "core independence," being "core independent," being "autonomous," or using terms that are derivations thereof. Although a processing core or CPU may initialize parameters (e.g., set initial upper and lower threshold values for analog signal threshold detection, without limitation) of the circuitry, such circuitry may perform the operations for slew rate measurement, state detection, state change detection, and threshold detection discussed herein without intervention from, or supervision by, the processing core or CPU. Accordingly, operations of slew rate measurement, state detection, and threshold detection may be performed without interrupting a processing core or CPU while a processing core or CPU is otherwise engaged, or without enabling a processing core or CPU while it is in a disabled state. Valuable power and processing bandwidth may be conserved as compared to, as a non-limiting example, computing systems that require the processing core or CPU to enable and disable multiple analog signal threshold detection circuits or measurement circuits as discussed above.

FIG. 1 is a block diagram depicting a signal transmission system 100 configured to perform autonomous slew rate sensing, in accordance with one or more embodiments. A signal transmission link 108 is defined by a transmitter 104 and receiver 106 configured to send and receive discrete signals, respectively, via signal path 116. Signal path 116 may include any combination of wired and un-wired portions. Transmitter 104 is configured, generally, to generate and/or provide a discrete signal. As non-limiting examples, transmitter 104 may be or include a serial or parallel communication transmitter or transceiver, a signal generator such as a pulse-width or pulse-duration modulator, or a clock source. Receiver 106 is configured, generally, to receive a discrete signal. As non-limiting examples, receiver 106 may be or include a serial or parallel communication receiver or transceiver, an electronic component configured to receive a pulse-width or pulse-duration modulated signal, or an electronic component configured to receive a clock signal.

Autonomous sensor 102 may be configured, generally, to detect and measure state changes of discrete signals, here, observed signals 114. Autonomous sensor 102 is arranged to observe one or more discrete signals conveyed on signal path 116—labelled as observed signals 114. In one or more embodiments, autonomous sensor 102 may be coupled to a portion of transmitter 104, receiver 106, or signal path 116 that may exhibit, or be affected by, slew rate decay. In some cases there may be a desire to observe a discrete signal substantially as input to receiver 106, in which cases, autonomous sensor 102 may be coupled to a location of signal path 116 that is physically or electrically "close" to receiver 106, coupled to a terminal circuit from which receiver 106 reads a discrete signal, or coupled to an input pin of receiver 106, without limitation, such that observed signal 114 substantially matches a signal received by receiver 106.

As another non-limiting example, autonomous sensor 102 may be coupled to a portion of signal path 116 in the vicinity of, or after, a connector (e.g., a physical connector such as a wire or trace, or an unwired connector such as a capacitive or inductive signal coupler, without limitation) that couples portions of signal path 116. As yet another non-limiting example, autonomous sensor 102 may be coupled to a location at signal transmission link 108 where the portion of signal transmission link 108 coupling the location to transmitter 104 is some specific length (e.g., a pre-determined, pre-specified or specified length, without limitation) associated with slew rate decay. Other selection criteria for coupling location than those discussed do not exceed the scope of this disclosure. Use of multiple autonomous slew rate sensors, each an autonomous sensor 102, does not exceed the scope of this disclosure. For example, in some embodiments multiple portions of signal transmission link 108 may have coupled thereto an autonomous sensor 102, or a portion of signal transmission link 108 may have coupled thereto multiple such autonomous slew rate sensors.

Optional CPU 110 is coupled to signal transmission link 108 and autonomous sensor 102 and, generally speaking, configured to communicate with and/or initialize autonomous sensor 102 via signals 112 (e.g., communication or control signals, without limitation) as discussed later herein (e.g., at set up).

In one or more embodiments, signal transmission system 100 may be implemented in a single system or device or multiple systems or devices. As non-limiting examples, portions or a totality of signal transmission system 100 may be implemented in a system on-a-chip, a system on separate chips, in one or more microcontrollers, and combinations and subcombinations thereof. In one or more embodiments, transmitter 104 or receiver 106 may include autonomous sensor 102. In one or more embodiments, an electronic component coupled to, or comprising a portion of, signal path 116 may include autonomous sensor 102. In one or more embodiments, autonomous sensor 102 may be implemented by a chip, microcontroller, or device that is coupled to signal path 116. In one or more embodiments, CPU 110 may be a CPU of a device or microcontroller including an implementation of autonomous sensor 102, and optionally transmitter 104 and receiver 106, for example, in peripherals of such a device or microcontroller.

In one or more embodiments, signal path 116 may include 1 to n wired or unwired signal sub-paths (where n≥2), as a non-limiting example, for parallel communication. Signal transmission system 100 may include a number of autonomous slew rate sensors, each an autonomous sensor 102, individually coupled to each signal sub-path (e.g., to each line, without limitation) of signal path 116 or portions thereof. While the specific example depicted by FIG. 1 includes a same number of autonomous slew rate sensors as signal paths, one-to-one correspondence is not required and a signal transmission system 100 may include any number of autonomous sensor 102 without exceeding the scope of this disclosure.

Figure 2:
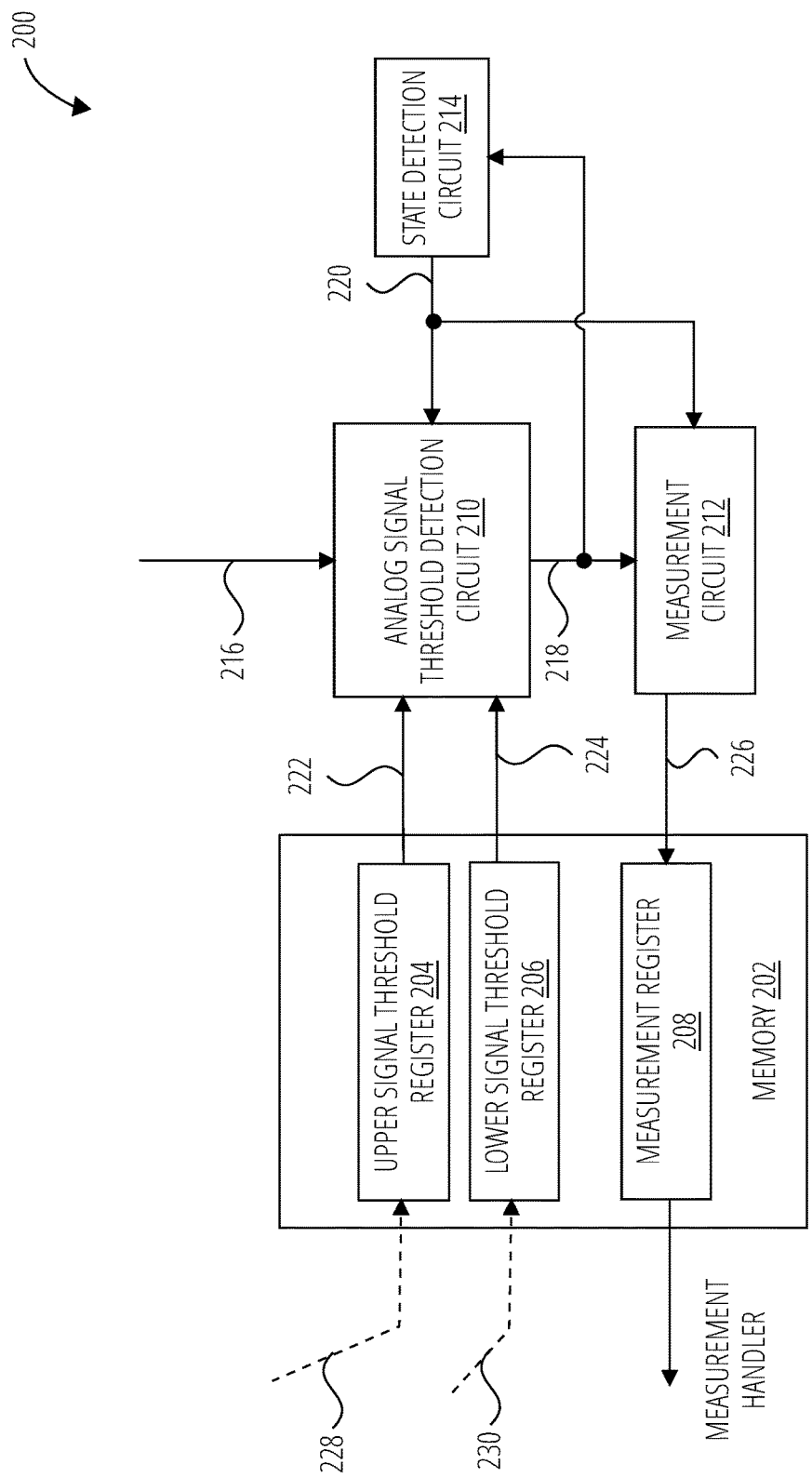
FIG. 2 is a block diagram of an autonomous sensor in accordance with one or more embodiments.

FIG. 2 is a block diagram depicting an autonomous sensor 200, in accordance with one or more embodiments. Autonomous sensor 200 is a non-limiting example of an autonomous sensor 102 of FIG. 1.

Autonomous sensor 200 may be configured, generally, to calculate a measurement that is associated with an input signal, here observed signal 216, and store it at measurement register 208 of memory 202. Non-limiting examples of calculated measurements include: slew rate, frequency, total operational time, time in a specific state, number of state change per some specified period, differences in the foregoing at different time periods, and changes in the foregoing over time. Autonomous sensor 200 may include memory 202, analog signal threshold detection circuit 210, measurement circuit 212, and state detection circuit 214.

State detection circuit 214 may be configured, generally, to generate signal state indication 220 for provision to analog signal threshold detection circuit 210 and measurement circuit 212. Signal state indication 220 may be an indication of a current state of observed signal 216. In one or more embodiments, available states to be indicated include: below a lower signal threshold, above an upper signal threshold, between the lower and upper signal thresholds and rising (e.g., a rising edge of a signal having a signal level between specified thresholds, without limitation), and between the lower and upper signal thresholds and falling (e.g., a falling edge of a signal having a signal level between specified thresholds, without limitation).

Analog signal threshold detection circuit 210 may be configured, generally, to assert threshold detected indication 218 in response to observed signal 216, signal state indication 220, and upper threshold reference signal 222 or lower threshold reference signal 224. Analog signal threshold detection circuit 210 may alternately select a reference signal based on either upper threshold reference signal 222 or lower threshold reference signal 224 in response to a state indicated by signal state indication 220, and assert threshold detected indication 218 in response to detecting that a signal level of observed signal 216 is greater than (i.e., above) the selected reference signal.

Upper and lower threshold reference signals 222 and 224 may be or be based on values stored at upper signal threshold register 204 and lower signal threshold register 206, respectively. The stored values may correspond to or represent specific (e.g., specified, pre-specified, or pre-determined, without limitation) threshold values for signal levels expected for observed signal 216. In the specific example depicted by FIG. 2, the specific threshold values are programmed upper signal threshold value 228 and programmed lower signal threshold value 230, provided, by way of non-limiting example, by CPU 110, a configuration register (not shown), a configuration tool (not shown), or combinations thereof.

Figure 3:
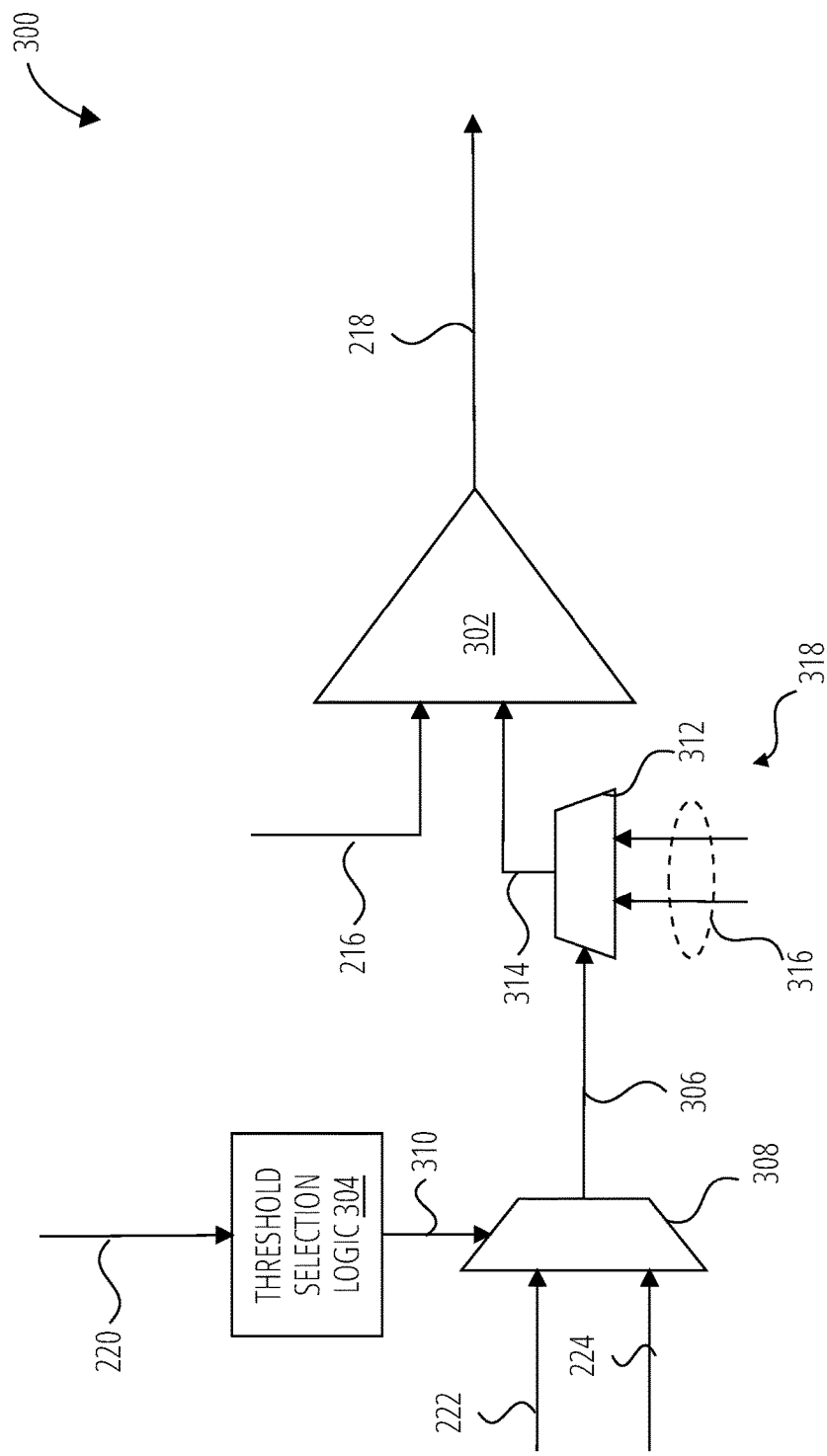
FIG. 3 is a block diagram of an analog signal threshold detection circuit in accordance with one or more embodiments.

Notably, a programmed threshold value (e.g., programmed upper signal threshold value 228 and programmed lower signal threshold value 230, without limitation), a stored signal threshold value (e.g., stored at upper signal threshold register 204 or lower signal threshold register 206, without limitation), or a value or signal level of a reference signal (e.g., upper threshold reference signal 222 and lower threshold reference signal 224 or fixed-level reference signal 314 of FIG. 3, without limitation) based thereon may be offset from a corresponding discrete signal level. Signal threshold values and signal levels that are the same or offset from specified signal thresholds of discrete signals (e.g., specified by an industry standard, a data sheet, a configuration file or register, or a technical specification, without limitation) are contemplated herein and encompassed by the term "signal threshold." An offset may be used, as non-limiting examples, for timing purposes and to address noise or decay (e.g., noise or amplitude decay expected on a transmission line, without limitation).

In one or more embodiments, analog signal threshold detection circuit 210 may be configured to alternately use upper threshold reference signal 222 or lower threshold reference signal 224 in response to signal state indication 220. As discussed later with respect to FIG. 3, analog signal threshold detection circuit 210 may be configured to use the lower threshold reference signal 224 when signal state indication 220 corresponds to below a lower signal threshold or between a lower and an upper signal threshold and falling (e.g., a falling edge), and to use the upper threshold reference signal 222 when signal state indication 220 corresponds to above an upper signal threshold or between a lower and an upper signal thresholds and rising (e.g., a rising edge).

Autonomous sensor 200 may be configured to provide threshold detected indication 218 that is asserted/de-asserted by analog signal threshold detection circuit 210 to measurement circuit 212 and state detection circuit 214. Measurement circuit 212 may be configured, generally, to generate a slew rate measurement 226 in response to threshold detected indication 218 and signal state indication 220.

State detection circuit 214 may be configured, generally, to generate signal state indication 220 responsive to threshold detected indication 218, and more specifically to modify the state indicated by signal state indication 220 in response to assertions/de-assertions of threshold detected indication 218 and a previous state indicated by signal state indication 220. As a non-limiting example, upon assertion/de-assertions of threshold detected indication 218, state detection circuit 214 may be configured to use a previous state and a map of possible state transitions (a "state transition map") to determine a new state for the observed signal 216.

In one or more embodiments, state detection circuit 214 may be configured to detect an initial state of observed signal 216, for example, at startup of autonomous sensor 200. As a non-limiting example, an initial state may be detected by assuming a state of observed signal 216 and then adjusting the assumed state in response to assertions/de-assertions of threshold detected indication 218 (e.g., using specific pattern of states via signal state indication 220, without limitation) until settling on a current state of observed signal 216. In embodiments where state detection circuit 214 is configured to detect an initial state at start-up of autonomous sensor 200, autonomous sensor 200 may be activated and de-activated (e.g., by CPU 110 or another device, without limitation) as desired.

By way of specific non-limiting example, upon startup of autonomous sensor 200, state detection circuit 214 may configure (via selection of a specific state for signal state indication 220) the analog signal threshold detection circuit 210 to use a lower signal threshold (e.g., stored at lower signal threshold register 206 of memory 202) and received at analog signal threshold detection circuit 210 as lower threshold reference signal 224. If analog signal threshold detection circuit 210 does not immediately assert threshold detected indication 218 in response to the lower signal threshold, state detection circuit 214 is thus aware that observed signal 216 is below the lower signal threshold and sets the signal state indication 220 to "below lower signal threshold." If analog signal threshold detection circuit 210 immediately asserts threshold detected indication 218, that would indicate that a signal level of observed signal 216 is above the lower signal threshold. If a signal level of observed signal 216 is above the lower signal threshold value, state detection circuit 214 may configure (via selection of a specific state for signal state indication 220) the analog signal threshold detection circuit 210 to use an upper signal threshold (e.g., stored at upper signal threshold register 204 of memory 202) and received at analog signal threshold detection circuit 210 as upper threshold reference signal 222. If the analog signal threshold detection circuit 210 does not immediately de-assert the threshold detected indication 218 then that would indicate that a signal level of the observed signal 216 is above the upper signal threshold and state detection circuit 214 sets the signal state indication 220 to indicate a state indicating "above upper signal threshold." If analog signal threshold detection circuit 210 immediately de-asserts a threshold detection indication 218 in response to an upper signal threshold, then state detection circuit 214 is aware that the observed signal 216 is between the upper and lower signal thresholds, however there is no indication as to whether the observed signal is rising or falling, and so may wait until a threshold detection indication 218 is asserted and, in response to assertion of threshold detection indication 218, set signal state indication 220 to indicate a state indicating "above upper signal threshold."

Upon detecting a current state of an observed signal 216, state detection circuit 214 may set signal state indication 220 to the detected current state, accordingly, and continuously update the state indication responsive to the state information gleaned from assertions/de-assertions of threshold detected indication 218 and a previous state according to state transition logic, as a non-limiting example, as set forth in Table 1:

TABLE 1

State Transitions Detected By State Detection Circuitry

| Threshold Detected | Previous State of Signal State Indication | Observed Signal Activity | New State of Signal State Indication |
| --- | --- | --- | --- |
| de-asserted to asserted | below lower signal threshold | crossed from below to above lower threshold | between lower and upper signal thresholds and rising |
| de-asserted to asserted | between lower and upper signal thresholds and rising | crossed from below to above upper threshold | above upper signal threshold |
| asserted to de-asserted | above upper signal threshold | crossed from above to below upper threshold | between lower and supper signal thresholds and falling |
| asserted to de-asserted | between lower and upper signal thresholds and falling | crossed from above to below lower threshold | below lower signal threshold |

FIG. 3 is a block diagram depicting an analog signal threshold detection circuit 300, in accordance with one or more embodiments. Analog signal threshold detection circuit 300 is a non-limiting example of analog signal threshold detection circuit 210 of FIG. 2. Analog signal threshold detection circuit 300 may include threshold selection logic 304, selection circuit 308, digital-to-discrete signal transformer 318, and analog signal threshold detector 302.

Selection circuit 308 may be configured to alternately select upper threshold reference signal 222 or lower threshold reference signal 224 available at inputs (not labeled) of selection circuit 308 in response to selection signal 310, and provide a digital reference signal 306 that corresponds to the selected signal. Threshold selection logic 304 may be configured to generate, in response to signal state indication 220, selection signal 310 to control selection of upper threshold reference signal 222 or lower threshold reference signal 224 at selection circuit 308 according to logic configured, as a non-limiting example, as set forth in Table 2:

TABLE 2

Selection of Threshold Reference Signals

| Signal State Indication | Selected Input At Selection Circuitry |
| --- | --- |
| below lower signal threshold | Lower threshold reference signal |
| between lower and upper signal thresholds and rising | upper threshold reference signal |
| above upper signal threshold | upper threshold reference signal |
| between lower and upper signal thresholds and falling | Lower threshold reference signal |

Digital reference signal 306 is provided to digital-to-discrete signal transformer 318. Digital-to-discrete signal transformer 318 may be configured to generate, in response to a digital signal, a fixed-level reference signal having a signal level suitable for comparison, by analog signal threshold detector 302, to observed signal 216. The fixed-level reference signal, or signal level thereof, may correspond to a value represented by the digital signal. In the specific example depicted by FIG. 3, digital-to-discrete signal transformer 318 includes selection circuit 312 configured to select and provide a fixed-level reference signal 314 (e.g., a bandgap voltage reference, without limitation) from among a number of fixed-level reference signals 316 (e.g., a number of available bandgap voltage references available, without limitation) available at inputs of selection circuit 312. In another embodiment, digital-to-discrete signal transformer 318 may be or include a digital-to-analog-converter (DAC).

Fixed-level reference signal 314 is provided to a reference input (input not labeled) of analog signal threshold detector 302. Analog signal threshold detector 302 may be configured to assert the threshold detected indication 218 in response to detecting that a signal level of observed signal 216 is greater than a signal level of fixed-level reference signal 314, and to de-assert the threshold detection indication 218 in response to detecting that a signal level of observed signal 216 is less than a signal level of fixed-level reference signal 314. In another embodiment, the upper and lower threshold references may be read directly from memory as voltage signals having discrete voltage levels suitable for use as fixed-level reference signal 314 by analog signal threshold detector 302.

Notably, as depicted by FIG. 3, analog signal threshold detection circuit 300 may include a single analog signal threshold detector 302 that may be alternately provided upper threshold reference signal 222 and lower threshold reference signal 224 as a fixed-level reference signal 314.

Figure 4A:
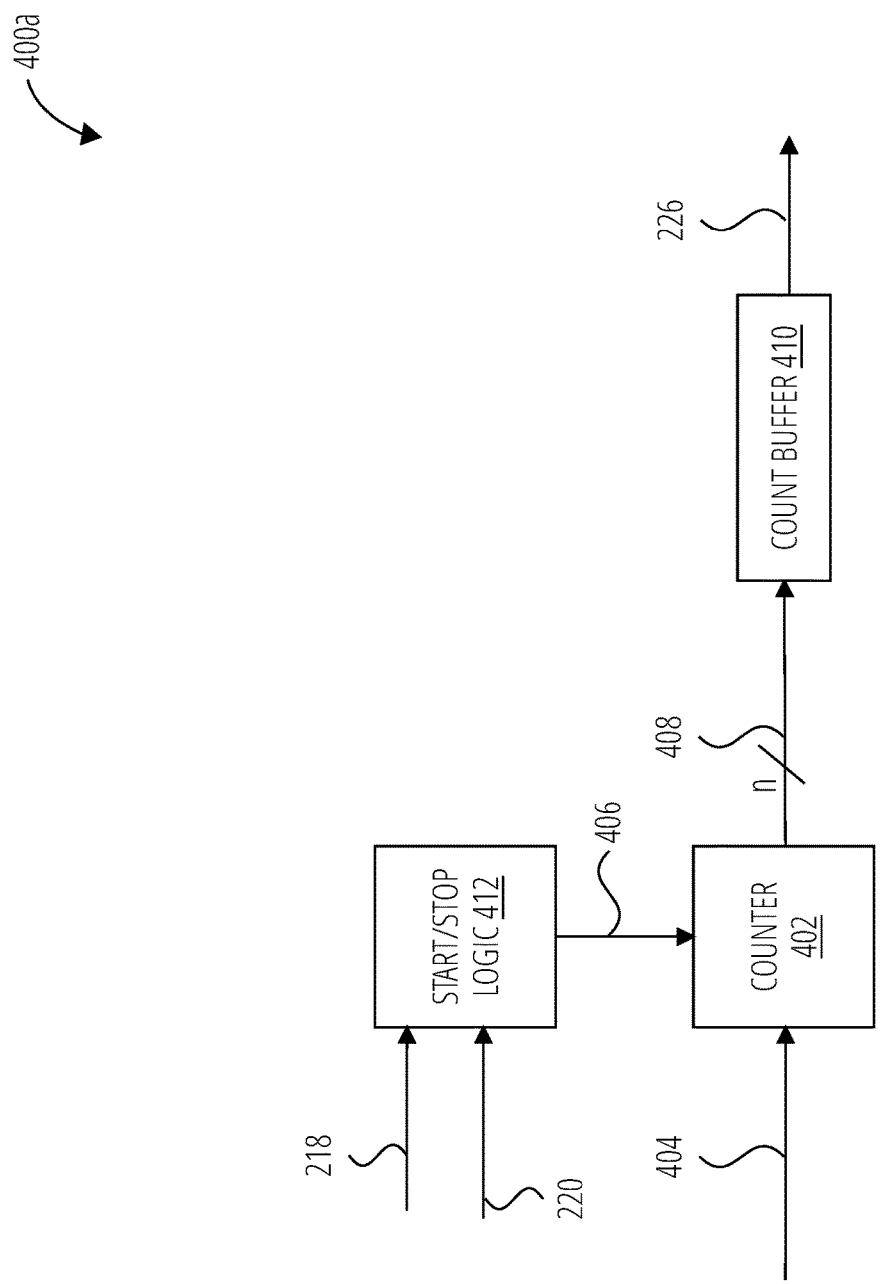
FIGS. 4A, 4B and 4C are block diagrams of a measurement circuit in accordance with one or more embodiments.

FIG. 4A is a block diagram depicting a measurement circuit 400a, in accordance with one or more embodiments. Measurement circuit 400a is a non-limiting example of measurement circuit 212 of FIG. 2, where the slew rate measurement 226 is a count.

Counter 402 may be configured to increment a count 408 in response to a start/stop signals 406 generated by start/stop logic 412, and provide the count 408 (here, as an n-bit signal) to count buffer 410. In one or more embodiments, counter 402 may be configured to increment the count 408 for a countable element 404 used to represent time, such as each clock cycle of clock or a derivation thereof such as every rising or falling edge of a clock or some multiple of clock cycles of a clock (e.g., every 2, 4, or 8 clock cycles, without limitation).

In one or more embodiments, a slew rate measurement may be determined in response to a measurement of time (e.g., a count 408, without limitation) between a lower signal threshold and an upper signal threshold (referred to herein as a "rising time"), determined in response to a time between an upper signal threshold and a lower signal threshold (referred to herein as a "falling time"), or determined in response to a time between states such as "above upper signal threshold" and "below lower signal threshold" discussed above.

In a case of slew rate determined in response to a rising time, start/stop logic 412 may be configured to generate a start signal in response to a signal state indication 220 corresponding to below a lower signal threshold and assertion of a threshold detected indication 218 and generate a stop signal in response to a signal state indication 220 corresponding to between a lower and an upper threshold and rising and assertion of a threshold detected indication 218.

In a case of slew rate based on falling time, start/stop logic 412 may be configured to generate a start signal in response to a signal state indication 220 corresponding to above an upper signal threshold and de-assertion of threshold detected indication 218 and generate a stop signal in response to a signal state indication 220 corresponding to between a lower and upper thresholds and falling and a second de-assertion of threshold detected indication 218 (after an intermediate assertion of threshold detected indication 218).

In one or more embodiments, start/stop logic 412 may be configured to generate start/stop signals 406 in response to assertions/de-assertions of threshold detected indication 218 and a state indicated by signal state indication 220 as discussed in Table 3:

TABLE 3

Start/Stop Signals Based on Signal State Indications

| Signal State Indication | Threshold Detected | Start/Stop Signal |
|---|---|---|
| below lower signal threshold | asserted | Start |
| between lower and upper signal thresholds and rising | asserted | Stop |
| above upper signal threshold | de-asserted | Start |
| between lower and upper signal thresholds and falling | de-asserted | Stop |

In another embodiment, start/stop logic 412 may be configured to generate start/stop signals 406 in response to detected changes in the states indicated by signal state indication 220 such as: a "start" in response to a change from below lower signal threshold to between lower and upper signal thresholds and rising, a "stop" in response to a change from between lower and upper signal threshold and rising to above upper signal threshold, a "start" in response to a change from above upper signal threshold to between lower and upper signal threshold and falling, and a "stop" in response to change from between lower and upper signal threshold and falling to below lower signal threshold.

Figure 4B:
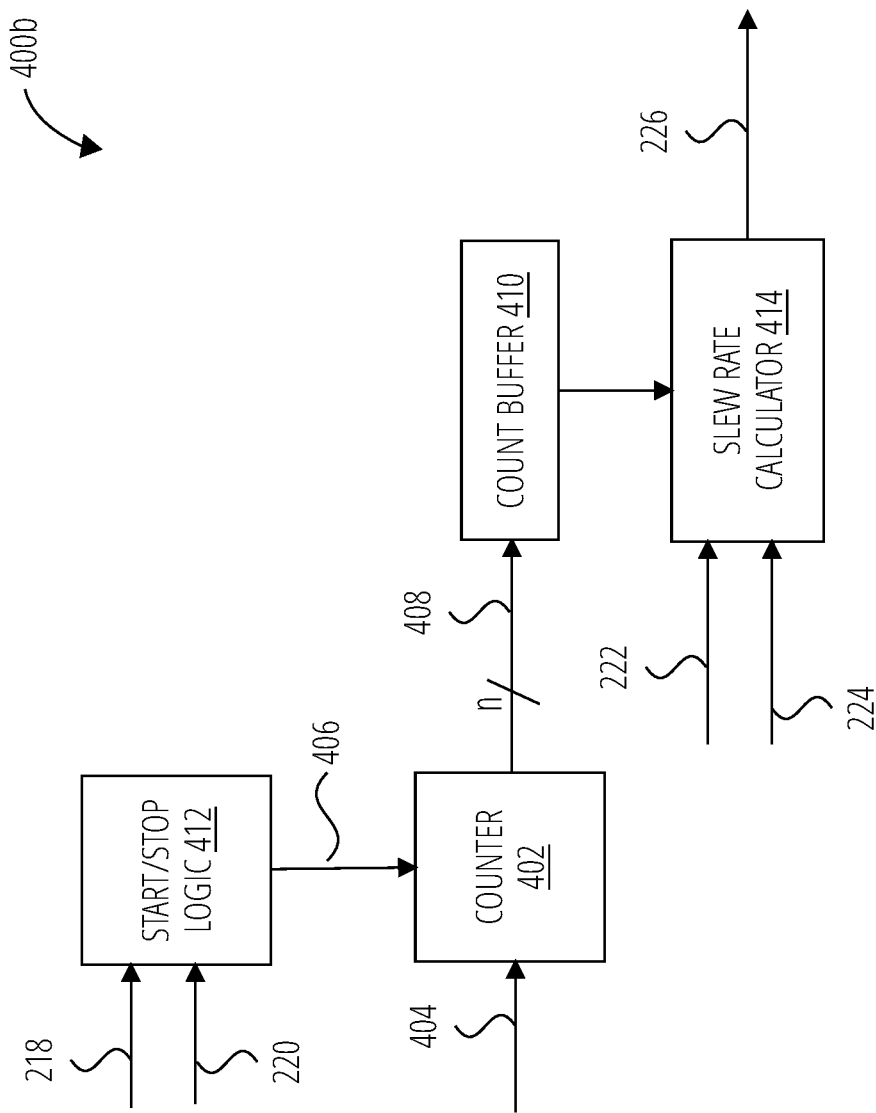

FIG. 4B is a block diagram depicting a measurement circuit 400b, in accordance with one or more embodiments. Measurement circuit 400b is a non-limiting example of measurement circuit 212 of FIG. 2 that optionally includes circuitry such that the slew rate measurement 226 is a calculated value for slew rate.

Elements of measurement circuit 400b bearing like reference labels to elements of measurement circuit 400a will not be re-described. Measurement circuit 400b includes slew rate calculator 414 configured to calculate a slew rate measurement 226 based on upper and lower threshold reference signals 222 and 224 and a count stored at slew rate count buffer 410.

Figure 4C:
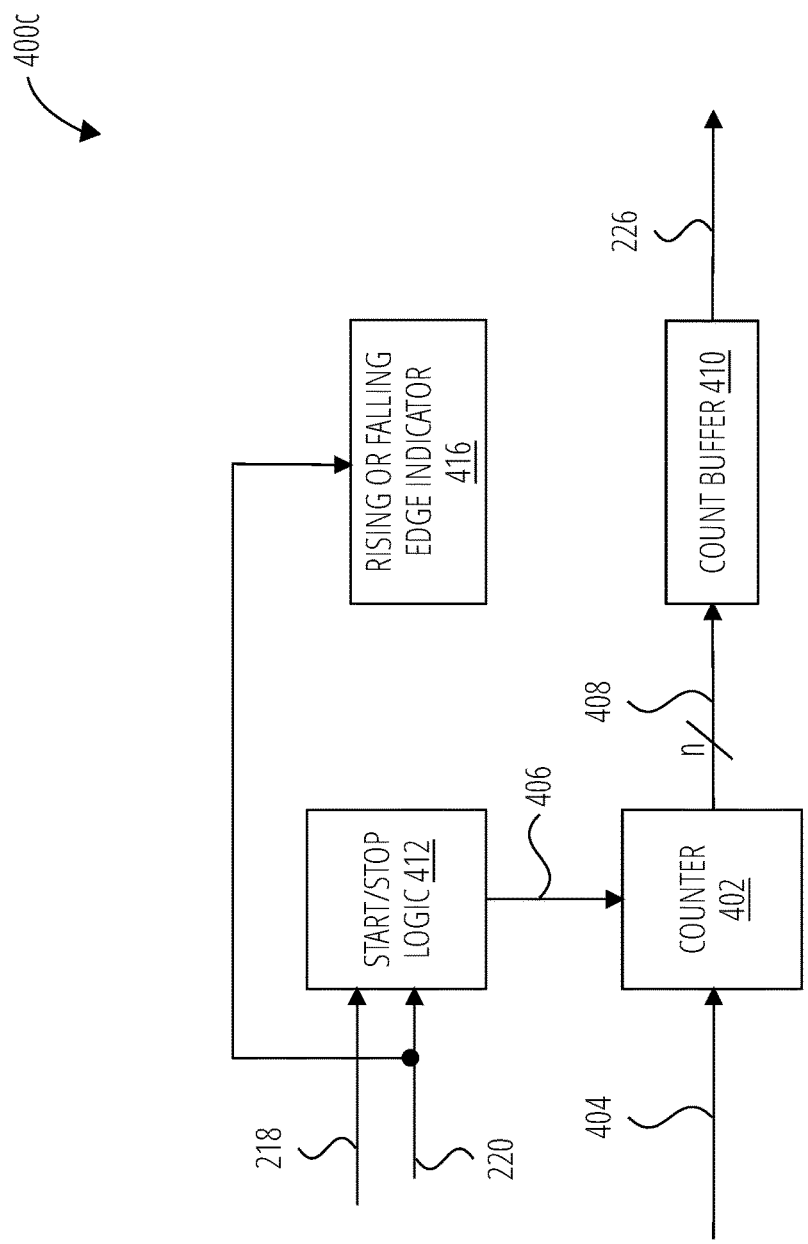

FIG. 4C is a block diagram depicting a measurement circuit 400c, in accordance with one or more embodiments. Measurement circuit 400c is a non-limiting example of measurement circuit 212 of FIG. 2 that optionally includes a rising or falling edge indicator 416 that may be used to indicate whether or not a slew rate measurement 226 corresponds to a rising edge or a falling edge in response to signal state indication 220. Elements of measurement circuit 400c bearing like reference labels to elements of measurement circuit 400a will not be re-described.

A person having ordinary skill in the art will appreciate numerous alterations or additions that may be made to measurement circuit 400a, 400b and 400c. Counter 402 and measurement circuits 400a, 400b and 400c may include logic blocks other than those depicted without exceeding the scope of this disclosure. As a non-limiting example, corrections may be performed to adjust counts, to average counts (i.e., to provide an average slew rate value of multiple signal edges (e.g., multiple falling edges, multiple rising edges, or multiple rising and falling edges, without limitation) additionally or alternatively to an absolute slew rate value), or to perform other processing, and counter 402 and measurement circuits 400a, 400b or 400c may optionally be configured to perform the same.

While the circuits of FIGS. 4A-4C have been specifically described in relation to a slew rate measurement, this is not meant to be limiting in any way. Any measurement may be performed, including the measurement of a periodic signal which changes substantially monotonically to rise above, and falls below, upper and lower signal thresholds. For example, a frequency of such a periodic signal may be measured by starting and stopping a counter 402 as described above, and determining a frequency based on a clock frequency of an input clock of counter 402.

Figure 5:
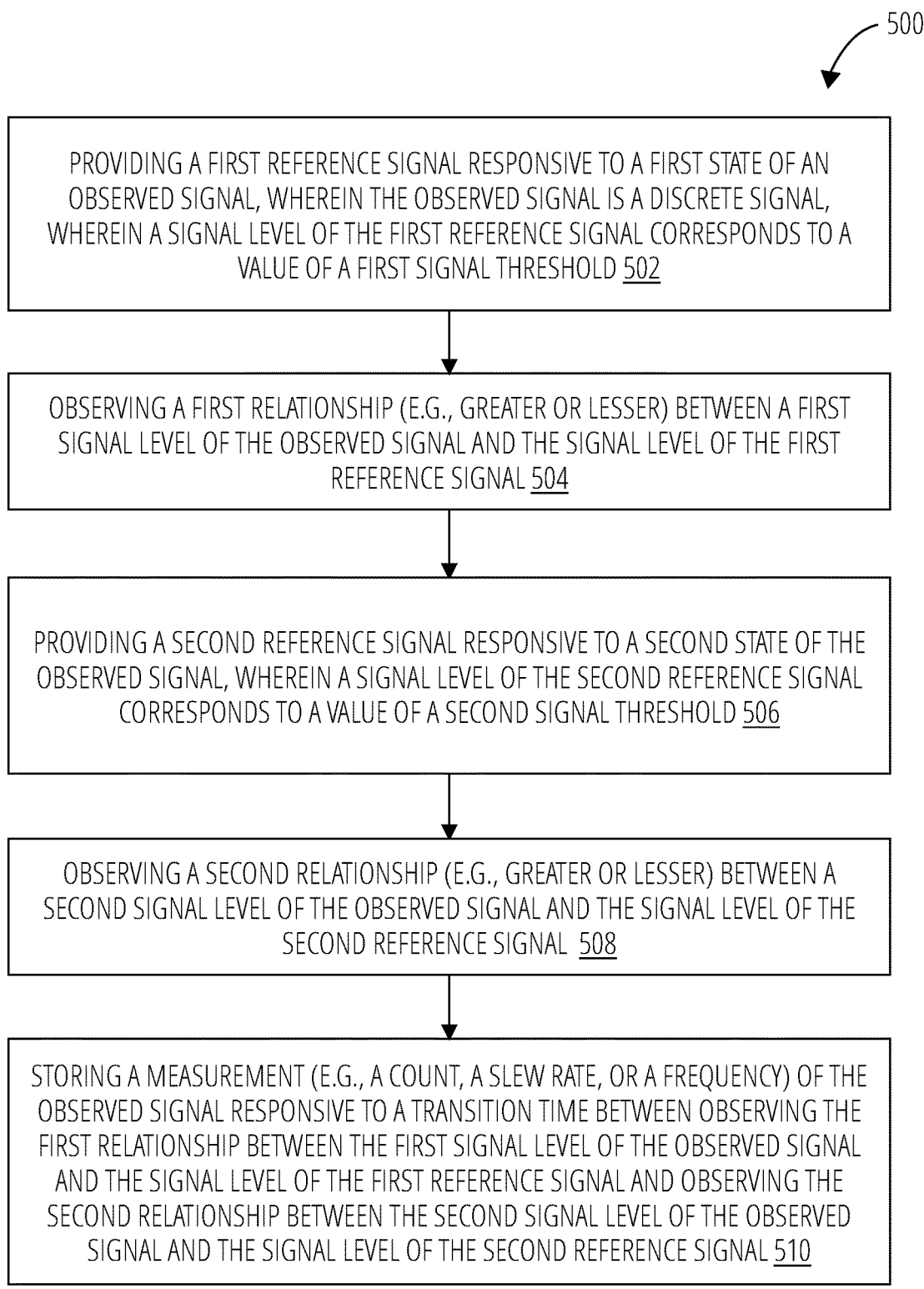
FIG. 5 is a flow diagram of a process in accordance with one or more embodiments.

FIG. 5 is a flow diagram depicting a process 500 for determining a slew rate of an observed signal in accordance with one or more embodiments. Process 500 may be performed, as a non-limiting example, by an autonomous sensor 102 and autonomous sensor 200.

At operation 502, process 500 provides a first reference signal responsive to a first state of an observed signal. The observed signal may be a discrete signal. The first state may be one of the states indicated by signal state indication 220 discussed herein. A signal level of the first reference signal corresponds to a value of a first signal threshold (e.g., stored at upper or lower signal threshold registers 204 and 206, respectively, without limitation). The first signal threshold and thus the first reference signal may be selected in response to the first state.

At operation 504, process 500 observes a first relationship between a first signal level of the observed signal and the signal level of the first reference signal. In one or more embodiments, the first relationship may be that the first signal level is greater or lesser than the signal level of the first reference signal.

At operation 506, process 500 provides a second reference signal responsive to a second state of the observed signal. A signal level of the second reference signal corresponds to a value of a second signal threshold (e.g., stored at upper or lower signal threshold registers 204 and 206, respectively, without limitation).

At operation 508, process 500 observes a second relationship between a second signal level of the observed signal and the signal level of the second reference signal. In one or more embodiments, the second relationship may be that the first signal level is greater or lesser than the signal level of the second reference signal.

In operations 504 and 508, whether process 500 observes that the first signal level of the observed signal is greater than or less than the signal level of the first reference signal may be in response to the state of the observed signal. If the state corresponds to a rising signal (i.e., a signal having a generally increasing amplitude) then process 500 observes that the signal level of the observed signal is above the signal level of a reference signal. If the state corresponds to a falling signal (i.e., a signal having a generally decreasing amplitude) then process 500 observes that the signal level of the observed signal is below the signal level of a reference signal.

At operation 510, process 500 stores a slew rate measurement of the observed signal responsive to a transition time between observing the first relationship between the first signal level of the observed signal and the signal level of the first reference signal and observing the second relationship between the second signal level of the observed signal and the signal level of the second reference signal. In various embodiments, the slew rate measurement may be a straight measurement of the time the observed signal takes to transition between the first and second signal levels or a more robust calculation.

Figure 6:
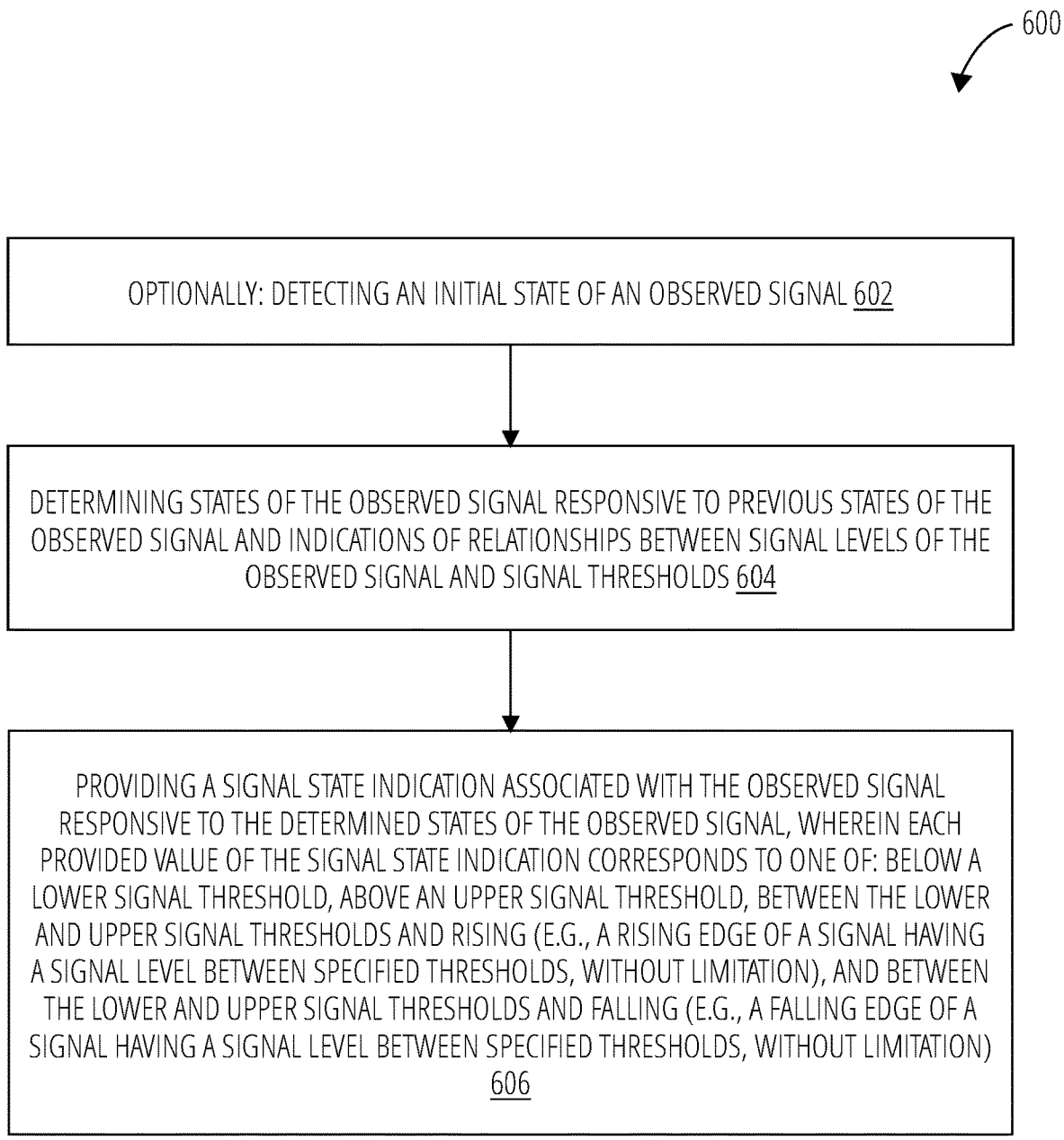
FIG. 6 is a flow diagram of a process in accordance with one or more embodiments.

FIG. 6 is a flow diagram of a process 600 for controlling the signal state indications, for example, by state detection circuit 214.

At operation 602, process 600 optionally detects an initial state of an observed signal as discussed herein.

At operation 604, process 600 determines states of the observed signal responsive to previous states of the observed signal and indications of relationships between signal levels of the observed signal and signal thresholds. The relationships may be that signal levels of the observed signal are greater than or less than the signal thresholds.

At operation 606, process 600 provides a signal state indication associated with the observed signal responsive to the determined states of the observed signal. Each provided value of the signal state indication corresponds to one of: below a lower signal threshold, above an upper signal threshold, between the lower and upper signal thresholds and rising (e.g., a rising edge of a signal having a signal level between specified thresholds, without limitation), and between the lower and upper signal thresholds and falling (e.g., a falling edge of a signal having a signal level between specified thresholds, without limitation).

Figure 7:
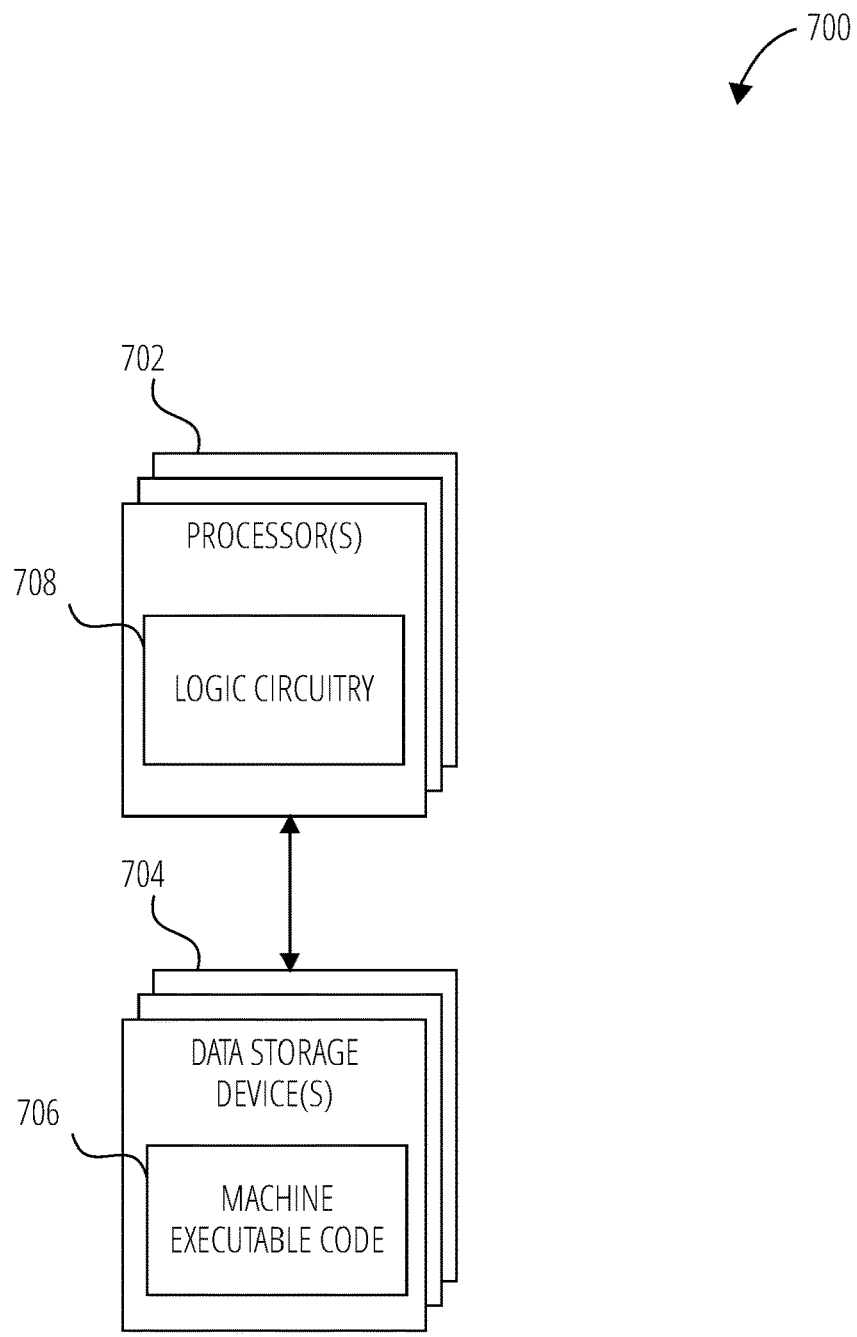
FIG. 7 illustrates a circuitry that may be used to implement various functions, operations, acts, processes, and/or methods in accordance with one or more embodiments.

It will be appreciated by those of ordinary skill in the art that functional elements of embodiments disclosed herein (e.g., functions, operations, acts, processes, and/or methods, without limitation) may be implemented in any suitable hardware, software, firmware, or combinations thereof. FIG. 7 illustrates non-limiting examples of implementations of functional elements disclosed herein. In some embodiments, some or all portions of the functional elements disclosed herein may be performed by hardware specially configured for carrying out the functional elements.

FIG. 7 is a block diagram of circuitry 700 that, in some embodiments, may be used to implement various functions, operations, acts, processes, and/or methods disclosed herein. The circuitry 700 includes one or more processors 702 (sometimes referred to herein as "processors 702") operably coupled to one or more data storage devices (sometimes referred to herein as "storage 704"). The storage 704 includes machine executable code 706 stored thereon and the processors 702 include logic circuitry 708. The machine executable code 706 includes information describing functional elements that may be implemented by (e.g., performed by) the logic circuitry 708. The logic circuitry 708 is adapted to implement (e.g., perform) the functional elements described by the machine executable code 706. The circuitry 700, when executing the functional elements described by the machine executable code 706, should be considered as special purpose hardware configured for carrying out functional elements disclosed herein. In some embodiments the processors 702 may be configured to perform the functional elements described by the machine executable code 706 sequentially, concurrently (e.g., on one or more different hardware platforms), or in one or more parallel process streams.

When implemented by logic circuitry 708 of the processors 702, the machine executable code 706 is configured to adapt the processors 702 to perform operations of embodiments disclosed herein. For example, the machine executable code 706 may be configured to adapt the processors 702 to perform at least a portion or a totality of the features and functions discussed with reference to signal transmission system 100, autonomous sensor 200, analog signal threshold detection circuit 300, or measurement circuits 400a, 400b, and 400c. As a specific, non-limiting example, the machine executable code 706 may be configured to adapt the processors 702 to perform at least a portion of the analog signal threshold detection and slew rate measurement functions discussed herein, including, for example, process 500 of FIG. 5 and process 600 of FIG. 6. As a specific, non-limiting example, the machine executable code 706 may be configured to adapt the processors 702 to perform at least a portion of the logic discussed with respect to Table 1, Table 2 and Table 3.

The processors 702 may include a general purpose processor, a special purpose processor, a central processing unit (CPU), a microcontroller, a programmable logic controller (PLC), a digital signal processor (DSP), an application specific integrated circuit (ASIC), a field-programmable gate array (FPGA) or other programmable logic device, discrete gate or transistor logic, discrete hardware components, other programmable device, or any combination thereof designed to perform the functions disclosed herein. A general-purpose computer including a processor is considered a special-purpose computer while the general-purpose computer is configured to execute functional elements corresponding to the machine executable code 706 (e.g., software code, firmware code, hardware descriptions) related to embodiments of the present disclosure. It is noted that a general-purpose processor (may also be referred to herein as a host processor or simply a host) may be a microprocessor, but in the alternative, the processors 702 may include any conventional processor, controller, microcontroller, or state machine. The processors 702 may also be implemented as a combination of computing devices, such as a combination of a DSP and a microprocessor, a plurality of microprocessors, one or more microprocessors in conjunction with a DSP core, or any other such configuration.

In some embodiments the storage 704 includes volatile data storage (e.g., random-access memory (RAM)), non-volatile data storage (e.g., Flash memory, a hard disc drive, a solid state drive, erasable programmable read-only memory (EPROM), without limitation). In some embodiments the processors 702 and the storage 704 may be implemented into a single device (e.g., a semiconductor device product, a system on chip (SoC), without limitation). In some embodiments the processors 702 and the storage 704 may be implemented into separate devices.

In some embodiments the machine executable code 706 may include computer-readable instructions (e.g., software code, firmware code). By way of non-limiting example, the computer-readable instructions may be stored by the storage 704, accessed directly by the processors 702, and executed by the processors 702 using at least the logic circuitry 708. Also by way of non-limiting example, the computer-readable instructions may be stored on the storage 704, transferred to a memory device (not shown) for execution, and executed by the processors 702 using at least the logic circuitry 708. Accordingly, in some embodiments the logic circuitry 708 includes electrically configurable logic circuitry 708.

In some embodiments the machine executable code 706 may describe hardware (e.g., circuitry) to be implemented in the logic circuitry 708 to perform the functional elements. This hardware may be described at any of a variety of levels of abstraction, from low-level transistor layouts to high-level description languages. At a high-level of abstraction, a hardware description language (HDL) such as an IEEE Standard hardware description language (HDL) may be used. By way of non-limiting examples, VERILOG™, SYSTEMVERILOG™ or very large scale integration (VLSI) hardware description language (VHDL™) may be used.

HDL descriptions may be converted into descriptions at any of numerous other levels of abstraction as desired. As a non-limiting example, a high-level description can be converted to a logic-level description such as a register-transfer language (RTL), a gate-level (GL) description, a layout-level description, or a mask-level description. As a non-limiting example, micro-operations to be performed by hardware logic circuits (e.g., gates, flip-flops, registers, without limitation) of the logic circuitry 708 may be described in a RTL and then converted by a synthesis tool into a GL description, and the GL description may be converted by a placement and routing tool into a layout-level description that corresponds to a physical layout of an integrated circuit of a programmable logic device, discrete gate or transistor logic, discrete hardware components, or combinations thereof. Accordingly, in some embodiments the machine executable code 706 may include an HDL, an RTL, a GL description, a mask level description, other hardware description, or any combination thereof.

In embodiments where the machine executable code 706 includes a hardware description (at any level of abstraction), a system (not shown, but including the storage 704) may be configured to implement the hardware description described by the machine executable code 706. By way of non-limiting example, the processors 702 may include a programmable logic device (e.g., an FPGA or a PLC) and the logic circuitry 708 may be electrically controlled to implement circuitry corresponding to the hardware description into the logic circuitry 708. Also by way of non-limiting example, the logic circuitry 708 may include hard-wired logic manufactured by a manufacturing system (not shown, but including the storage 704) according to the hardware description of the machine executable code 706. Such manufacturing of hard-wired logic may also be characterized herein as permanently configuring logic circuitry of a processor.

Regardless of whether the machine executable code 706 includes computer-readable instructions or a hardware description, the logic circuitry 708 is adapted to perform the functional elements described by the machine executable code 706 when implementing the functional elements of the machine executable code 706. It is noted that although a hardware description may not directly describe functional elements, a hardware description indirectly describes functional elements that the hardware elements described by the hardware description are capable of performing.

A person having ordinary skill in the art will appreciate additional embodiments and advantages from the disclosure in Appendix A hereto, the entire contents and disclosure of which is incorporated herein, by this reference.

As used in the present disclosure, the term "combination" with reference to a plurality of elements may include a combination of all the elements or any of various different subcombinations of some of the elements. For example, the phrase "A, B, C, D, or combinations thereof" may refer to any one of A, B, C, or D; the combination of each of A, B, C, and D; and any subcombination of A, B, C, or D such as A, B, and C; A, B, and D; A, C, and D; B, C, and D; A and B; A and C; A and D; B and C; B and D; or C and D.

Terms used in the present disclosure and especially in the appended claims (e.g., bodies of the appended claims, without limitation) are generally intended as "open" terms (e.g., the term "including" should be interpreted as "including, but not limited to," the term "having" should be interpreted as "having at least," the term "includes" should be interpreted as "includes, but is not limited to," without limitation). As used herein, the term "each" means some or a totality. As used herein, the term "each and every" means a totality.

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more," without limitation); the same holds true for the use of definite articles used to introduce claim recitations.

In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations, without limitation). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

Additional non-limiting embodiments of the disclosure include:

Embodiment 1: A sensor, comprising a state detection circuit configured to generate a signal state indication about a state of an observed signal; an analog signal threshold detection circuit configured to alternately assert and de-assert a threshold detected indication responsive to the observed signal and the signal state indication; and a measurement circuit configured to generate a measurement responsive to assertions and de-assertions of the threshold detected indication and the signal state indication.

Embodiment 2: The sensor according to Embodiment 1, wherein the state detection circuit is configured to generate the signal state indication responsive to assertions and de-assertions of the threshold detection indication and a previous state of the observed signal.

Embodiment 3: The sensor according to any of Embodiments 1 and 2, wherein the analog signal threshold detection circuit comprises an analog signal threshold detector configured to: assert the threshold detected indication responsive to a first relationship between a fixed-level reference signal and the observed signal; and de-assert the threshold detected indication responsive to a second relationship between the fixed-level reference signal and the observed signal.

Embodiment 4: The sensor according to any of Embodiments 1 through 3, wherein the analog signal threshold detection circuit comprises a threshold selection logic configured to alternately select an upper or a lower threshold reference signal for the fixed-level reference signal responsive to the signal state indication.

Embodiment 5: The sensor according to any of Embodiments 1 through 4, wherein the analog signal threshold detection circuit comprises a signal selection circuit configured to provide the fixed-level reference signal responsive to the selected upper or a lower threshold reference signal.

Embodiment 6: The sensor according to any of Embodiments 1 through 5, wherein the measurement circuit comprises: a start/stop logic configured to alternately generate a start signal or a stop signal responsive to the threshold detected indication and the signal state indication; and a counter configured to increment a count during a time defined between a generated start signal and a generated stop signal.

Embodiment 7: The sensor according to any of Embodiments 1 through 6, wherein the counter is configured to increment the count responsive to a countable element, the countable element including one of: a clock cycle, a rising edge of a clock, or a falling edge of a clock.

Embodiment 8: The sensor according to any of Embodiments 1 through 7, wherein the measurement is one of a count, a slew rate, or a frequency.

Embodiment 9: The sensor according to any of Embodiments 1 through 8, wherein the measurement circuit comprises a rising or falling edge indicator.

Embodiment 10: The sensor according to any of Embodiments 1 through 9, further comprising an upper signal threshold register and a lower signal threshold register.

Embodiment 11: The sensor according to Embodiments 1 through 10, wherein the upper and lower signal threshold registers are respectively coupled to the analog signal threshold detection circuit.

Embodiment 12: The sensor according to any of Embodiments 1 through 11, further comprising a measurement register.

Embodiment 13: The sensor according to Embodiments 1 through 12, wherein the measurement register is coupled to the measurement circuit.

Embodiment 14: A method, comprising: providing a first reference signal responsive to a first state of an observed signal; observing a first relationship between a first signal level of the observed signal and a signal level of the first reference signal; providing a second reference signal responsive to a second state of the observed signal; observing a second relationship between a second signal level of the observed signal and a signal level of the second reference signal; and storing a measurement of the observed signal responsive to a transition time between observing the first relationship and the second relationship.

Embodiment 15: The method according to Embodiment 14, wherein the observed signal is a discrete signal.

Embodiment 16: The method according to any of Embodiments 14 and 15, wherein providing the first and second reference signals comprises providing a first and second fixed-level reference signals, respectively.

Embodiment 17: The method according to any of Embodiments 14 through 16, further comprising: determining states of the observed signal responsive to previous states of the observed signal and indications of relationships between signal levels of the observed signal and signal thresholds; and providing a signal state indication associated with the observed signal responsive to the determined states of the observed signal.

Embodiment 18: The method according to any of Embodiments 14 through 17, further comprising detecting an initial state of the observed signal.

Embodiment 19: The method according to any of Embodiments 14 through 18, further comprising receiving values for the signal thresholds.

Embodiment 20: A computing system, comprising: a processor; and a memory storage having thereon machine-executable code adapted to permanently configure logic circuitry of the processor to: provide a first reference signal responsive to a first state of an observed signal; observe a first relationship between a first signal level of the observed signal and a signal level of the first reference signal; provide a second reference signal responsive to a second state of the observed signal; observe a second relationship between a second signal level of the observed signal and a signal level of the second reference signal; and store a measurement of the observed signal responsive to a transition time between observing the first relationship and the second relationship.

The computing system of Embodiment 20 configured to perform according to any of Embodiments 1 through 19.

The present disclosure has been described herein with respect to certain illustrated embodiments, those of ordinary skill in the art will recognize and appreciate that the present invention is not so limited. Rather, many additions, deletions, and modifications to the illustrated and described embodiments may be made without departing from the scope of the invention as hereinafter claimed along with their legal equivalents. In addition, features from one embodiment may be combined with features of another embodiment while still being encompassed within the scope of the invention as contemplated by the inventor.

What is claimed is:

1. A sensor, comprising:
   a state detection circuit to generate a signal state indication about a state of an observed signal;
   an analog signal threshold detection circuit to alternately assert and de-assert a threshold detected indication responsive to the observed signal and the signal state indication; and
   a measurement circuit to generate a measurement responsive to assertions and de-assertions of the threshold detected indication and the signal state indication, wherein the measurement circuit comprises:
      a start/stop logic to alternately generate a start signal or a stop signal responsive to the threshold detected indication and the signal state indication; and
      a counter to increment a count during a time defined between a generated start signal and a generated stop signal.

2. The sensor of claim 1, wherein the state detection circuit is to generate the signal state indication responsive to assertions and de-assertions of the threshold detection indication and a previous state of the observed signal.

3. The sensor of claim 1, wherein the counter is to increment the count responsive to a countable element, the countable element including one of: a clock cycle, a rising edge of a clock, or a falling edge of a clock.

4. The sensor of claim 1, wherein the measurement is one of the count, a slew rate, or a frequency.

5. The sensor of claim 1, wherein the measurement circuit comprises a rising or falling edge indicator.

6. The sensor of claim 1, further comprising an upper signal threshold register and a lower signal threshold register.

7. The sensor of claim 6, wherein the upper and lower signal threshold registers are respectively coupled to the analog signal threshold detection circuit.

8. The sensor of claim 1, further comprising a measurement register.

9. The sensor of claim 8, wherein the measurement register is coupled to the measurement circuit.

10. A method, comprising:
    selecting a first reference signal responsive to an indicated signal state of an observed signal being a first signal state;
    observing a first relationship between a signal level of the observed signal and a signal level of the first reference signal;
    setting the indicated signal state of the observed signal to a second signal state responsive to a previously indicated signal state and the observed first relationship between the signal level of the observed signal and the signal level of the first reference signal, the second signal state different than the first signal state;
    starting a counter responsive to the indicated signal state of the observed signal being the second signal state;
    selecting a second reference signal responsive to the indicated signal state of the observed signal being the second signal state;
    observing a second relationship between the signal level of the observed signal and a signal level of the second reference signal;
    setting the indicated signal state of the observed signal to the first signal state responsive to the previously indicated signal state and the observed second relationship between the signal level of the observed signal and the signal level of the second reference signal;
    stopping the counter responsive to the indicated signal state of the observed signal being the first signal state; and
    storing a measurement of the observed signal responsive to a transition time between observing the first relationship and the second relationship indicated by a value of the counter.

11. The method of claim 10, wherein the observed signal is a discrete signal.

12. The method of claim 10, providing a first and second fixed-level reference signals as the first reference signal and the second reference signal, respectively.

13. The method of claim 10, further comprising:
    determining states of the observed signal responsive to previous states of the observed signal and indications of relationships between signal levels of the observed signal and signal thresholds; and
    providing a signal state indication associated with the observed signal responsive to the determined states of the observed signal.

14. The method of claim 13, further comprising detecting an initial state of the observed signal.

15. The method of claim 13, further comprising receiving values for the signal thresholds.

16. A computing system, comprising:
    a processor; and
    a memory storage having thereon machine-executable code adapted to permanently configure logic circuitry of the processor to:
       select a first reference signal responsive to an indicated signal state of an observed signal being a first signal state;
       observe a first relationship between a signal level of the observed signal and a signal level of the first reference signal;
       set the indicated signal state of the observed signal to a second signal state responsive to a previously indicated signal state and the observed first relationship between the signal level of the observed signal and the signal level of the first reference signal, the second signal state different than the first signal state;
       start a counter responsive to the indicated signal state of the observed signal being the second signal state;
       select a second reference signal responsive to the signal state of the observed signal being the second signal state;

observe a second relationship between the signal level of the observed signal and a signal level of the second reference signal;

set the indicated signal state of the observed signal to the first signal state responsive to the previously indicated signal state and the observed second relationship between the signal level of the observed signal and the signal level of the second reference signal;

stop the counter responsive to the indicated signal state of the observed signal being the first signal state; and store a measurement of the observed signal responsive to a transition time between observing the first relationship and the second relationship indicated by a value of the counter.

\* \* \* \* \*

UNITED STATES PATENT AND TRADEMARK OFFICE
CERTIFICATE OF CORRECTION

PATENT NO. : 11,811,410 B2  
APPLICATION NO. : 17/247954  
DATED : November 7, 2023  
INVENTOR(S) : Amund Aune Page 1 of 1

It is certified that error appears in the above-identified patent and that said Letters Patent is hereby corrected as shown below:

In the Specification  
Column 5, Line 26, change "EEPROM)), and" to --(EEPROM)), and--

Signed and Sealed this  
Twenty-seventh Day of February, 2024

Katherine Kelly Vidal  
*Director of the United States Patent and Trademark Office*